(12) United States Patent
Yip et al.

(10) Patent No.: US 11,688,463 B2
(45) Date of Patent: Jun. 27, 2023

(54) VERTICAL STRING DRIVER FOR MEMORY ARRAY

(71) Applicant: Micron Technology, Inc., Boise, ID (US)

(72) Inventors: Aaron S. Yip, Los Gatos, CA (US); Tomoko Ogura Iwasaki, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 170 days.

(21) Appl. No.: 16/948,236

(22) Filed: Sep. 9, 2020

(65) Prior Publication Data

US 2022/0076751 A1 Mar. 10, 2022

(51) Int. Cl.
*H01L 29/04* (2006.01)
*G11C 16/08* (2006.01)
*G11C 16/04* (2006.01)

(52) U.S. Cl.
CPC .......... *G11C 16/08* (2013.01); *G11C 16/0483* (2013.01); *H01L 29/04* (2013.01)

(58) Field of Classification Search
CPC combination set(s) only.
See application file for complete search history.

(56) References Cited

U.S. PATENT DOCUMENTS

| 2018/0166461 A1 | 6/2018 | Shim et al. |
| 2018/0197586 A1 | 7/2018 | Nguyen et al. |
| 2019/0043873 A1 | 2/2019 | Hasnat et al. |
| 2019/0156893 A1* | 5/2019 | Lee .......................... G11C 8/08 |
| 2019/0295653 A1 | 9/2019 | Yip |
| 2020/0227429 A1* | 7/2020 | Ji ............................ H01L 29/04 |

OTHER PUBLICATIONS

European Extended Search Report for European Patent Application No. 21195627.1, dated Jan. 21, 2022, 9 pages.

* cited by examiner

*Primary Examiner* — Jason Lappas
(74) *Attorney, Agent, or Firm* — Lowenstein Sandler LLP

(57) ABSTRACT

A memory device comprises a substrate and a memory array disposed above the substrate, the memory array comprising a plurality of vertically stacked layers, each vertically stacked layer comprising a plurality of word lines. The memory device further comprises a plurality of vertical string driver circuits disposed above the memory array, wherein each of the plurality of vertical string driver circuits comprises one or more semiconductor devices coupled to a respective one of the plurality of word lines.

18 Claims, 8 Drawing Sheets

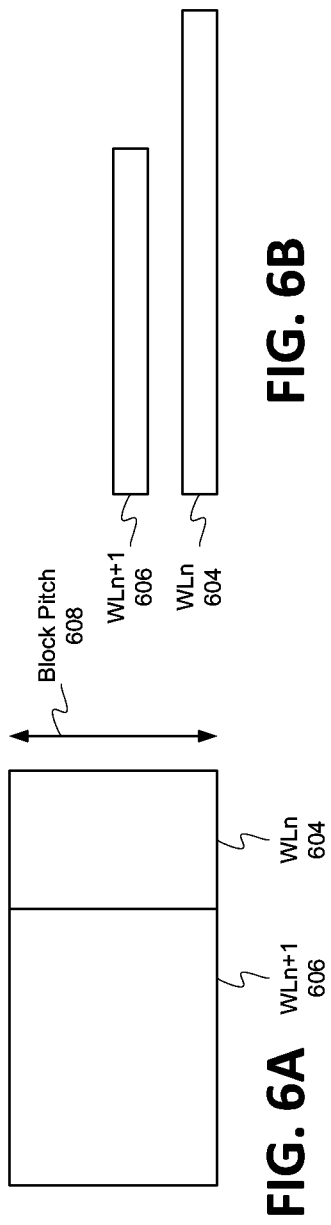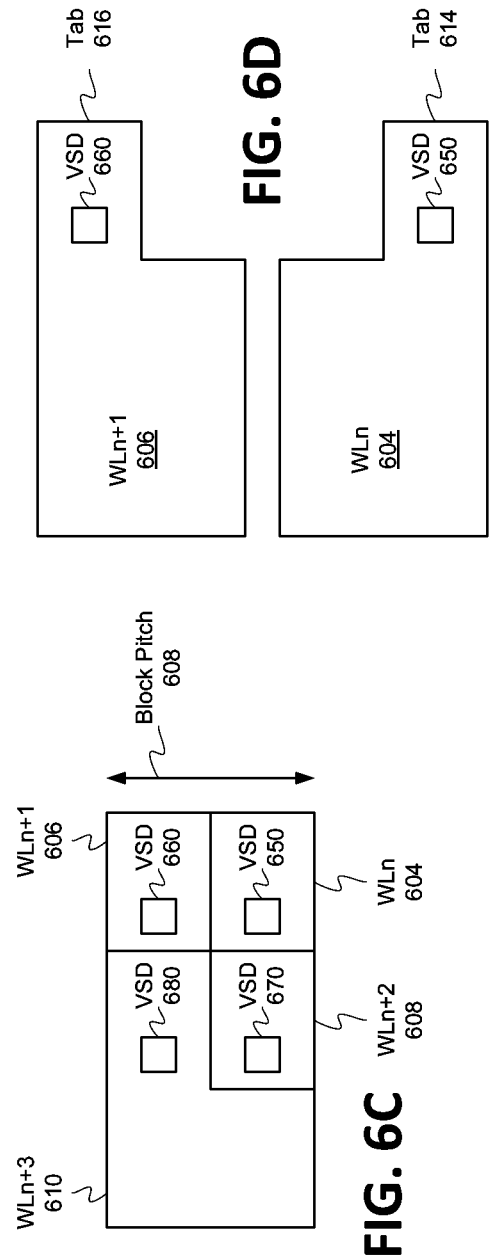

VERTICAL STRING DRIVER FOR MEMORY ARRAY

TECHNICAL FIELD

Embodiments of the disclosure relate generally to memory sub-systems, and more specifically, relate to a vertical string driver for a memory array in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIGS. 6A-6D are diagrams illustrating the exposed portions of each word line of a memory array in a memory device in accordance with some embodiments of the present disclosure.

DETAILED DESCRIPTION

Figure 1:
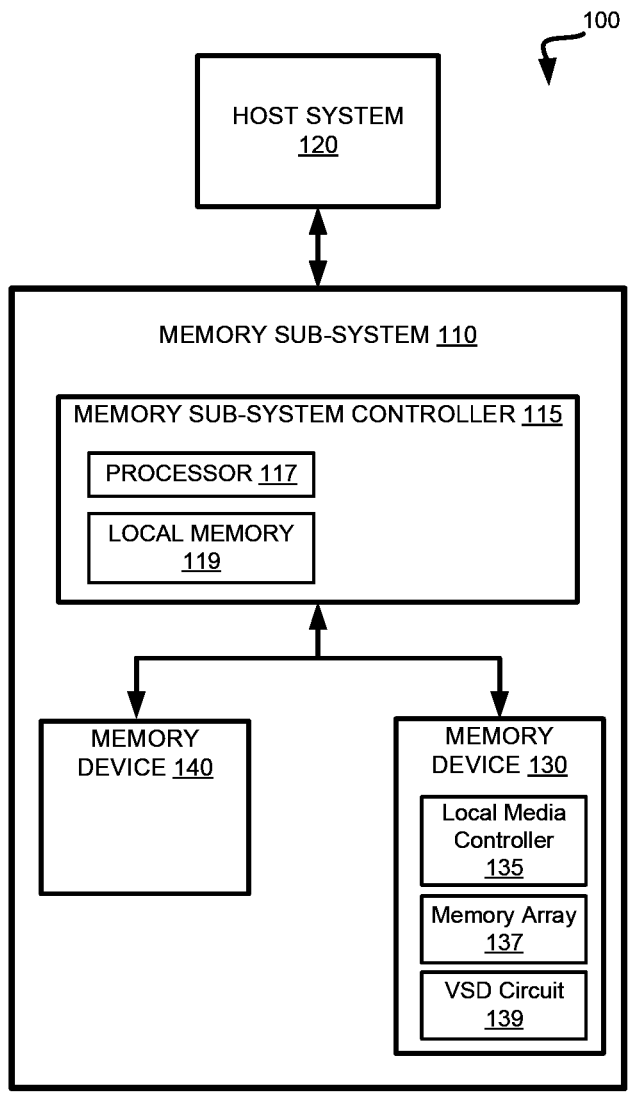
FIG. 1 illustrates an example computing system that includes a memory sub-system in accordance with some embodiments of the present disclosure.

Aspects of the present disclosure are directed to a vertical string driver for a memory array in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. For example, NAND memory, such as 3D flash NAND memory, offers storage in the form of compact, high density configurations. A non-volatile memory device is a package of one or more die, each including one or more planes. For some types of non-volatile memory devices (e.g., NAND memory), each plane includes of a set of physical blocks. Each block includes of a set of pages. Each page includes a set of memory cells ("cells"). A cell is an electronic circuit that stores information. A data block hereinafter refers to a unit of the memory device used to store data and can include a group of memory cells, a word line group, a word line, or individual memory cells. Each data block can include a number of sub-blocks, where each sub-block is defined by a set of associated pillars (e.g., vertical conductive traces) extending from a shared bit line. Memory pages (also referred to herein as "pages") store one or more bits of binary data corresponding to data received from the host system. To achieve high density, a string of memory cells in a non-volatile memory device can be constructed to include a number of memory cells at least partially surrounding a pillar of channel material. The memory cells can be coupled to access lines, which are commonly referred to as "word lines," often fabricated in common with the memory cells, so as to form an array of strings in a block of memory. The compact nature of certain non-volatile memory devices, such as 3D flash NAND memory, means word lines are common to many memory cells within a block of memory.

In order to perform memory access operations (e.g., program, read, or erase operations) on the memory cells, a string driver circuit is coupled to each word line and supplies corresponding memory access signals to the word line. In certain memory devices, the string driver circuits are positioned adjacent to (e.g., next to or within) the memory array occupying valuable area on the memory die. Any area used for the string driver circuits reduce the amount of area available for the memory array, thereby reducing the capacity of the memory device and increasing the relative cost. Other memory devices attempt to reduce the die area occupied by string driver circuits by positioning the string driver circuits beneath the memory array and directly on or within a substrate that forms the memory die. If, however, the memory device includes a three-dimensional memory array with multiple memory layers stacked vertically above the substrate, there are challenges associated with coupling the string driver circuits beneath the memory array to the word lines in each of the vertical layers. For example, as the number of vertical layers increases, so too does a number of through-array-vias that connect the string driver circuits to each word line. These connections reduce the number of memory cells and thus the overall capacity of the memory array. In addition, the string driver circuits occupy more and more of the available array on the substrate beneath the memory array, preventing other circuitry from being positioned there.

Aspects of the present disclosure address the above and other deficiencies by implementing a vertical string driver for a memory array in a memory sub-system. In one embodiment, a memory device includes a substrate, where the memory array is disposed above the substrate and includes a number of vertically stacked layers, each including a number of word lines. The memory device further includes a number of vertical string driver circuits disposed above the memory array. Each of the plurality of vertical string driver circuits includes one or more semiconductor devices coupled to a respective one of the word lines. Control logic within the memory device can cause access voltage signals to be applied to the word lines via the vertical string driver circuits during performance of corresponding memory access operations on the memory array. The memory device further includes a number of memory strings formed across the vertically stacked layers, where each memory string includes one or more select gate devices to couple the respective memory strings to a bit line of the memory array. In one embodiment, the one or more semiconductor devices of the vertical string driver circuits and the one or more select gate devices of the memory strings are disposed together in a common layer above the memory array (e.g., a layer of n-type metal oxide semiconductor (NMOS) devices). As described in more detail herein, the word lines in the vertically stacked layers of the memory array can be arranged to form a "staircase," such that a portion of a word line in a first vertically stacked layer is exposed beyond another word line in a second vertically stacked layer above the first vertically stacked layer, where a portion of that word line is exposed beyond yet another word line in a third vertically stacked layer above the second vertically stacked layer and so on. The exposed portion of each word line can be referred to as a "tread" and, in one embodiment, one or more vertical string driver circuits coupled to a respective word line are disposed above the exposed tread portion of that word line.

Advantages of the present disclosure include, but are not limited to, improved area utilization in the memory device. With the vertical string driver circuits being positioned above the memory array, the area under the array on the substrate that would have been occupied by those drivers is available for other circuitry. In addition, as there is a decreased need for vias or other electrical connections to run through the memory array, the storage capacity is increased. Furthermore, when the semiconductor devices of the vertical string driver circuits are formed in a common layer with the select gate devices of the memory strings, the processing costs are greatly reduced, since both sets of devices can be NMOS devices, and fabricated using fewer processing steps/layers.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 135) on the die and a controller (e.g., memory sub-system controller 115) for media management within the same memory device package. An example of a managed memory device is a managed NAND (MNAND) device. Memory device 130, for example, can represent a single die having some control logic (e.g., local media controller 135) embodied thereon. In other embodiment, local media controller 135 is configured to perform the functionality described herein. In such an embodiment, local media controller can be implemented using hardware or as firmware, stored on memory device 130, executed by control logic to perform the operations described herein. In some embodiments, one or more components of memory sub-system 110 can be omitted.

In one embodiment, memory device 130 includes memory array 137 and vertical string driver (VSD) circuit 139. Memory array 137 can include a number of layers of memory cells, each arranged in a two-dimensional grid. Each layer can include columns, also referred to as bit lines (BLs), and rows, also referred to as word lines (WLs). Each word line can refer to one or more rows of memory cells of a memory device that are used with one or more bit lines to generate the address of each of the memory cells. The intersection of a bit line and a word line constitutes the address of the memory cell. In one embodiment, memory array 137 can include multiple layers stacked vertically on top of one other to form a three-dimensional memory array. A block refers to a unit of the memory device 130 used to store data and can include a group of memory cells, a word line group, a word line, or individual memory cells. One or more blocks can be grouped together to form a plane of the memory device 130 in order to allow concurrent operations to take place on each plane.

In one embodiment, one or more string driver circuits, such as vertical string driver circuit 139, are disposed above memory array 137. In one embodiment, memory device includes a substrate (illustrated in FIG. 2), with the memory array 137 being disposed above the substrate, and the vertical string driver circuit 139 being disposed above the memory array 137 (i.e., on the opposite side of the memory array 137 from the substrate, such that the memory array 137 is positioned between the substrate and the vertical string driver circuit 139.) In one embodiment each of the word lines in the memory array 137 can be coupled to one or more respective access vertical string driver circuits 139. The vertical string driver circuits 139 can be configured to condition a page of a respective block of memory array 137 for a memory access operation, such as programming data (i.e., writing data), reading data, or erasing data. Each of the vertical string driver circuits 139 can be coupled to a respective global access line. Each of the global access lines can be selectively coupled to respective local access lines within a block during a memory access operation associated with a page within the block. The vertical string driver circuits 139 can be controlled based on signals from local media controller 135. Each of the vertical string driver circuits 139 can include or be coupled to a respective power circuit, and can provide voltages to respective word lines of the memory array 137 based on voltages provided by the respective power circuit. The voltages provided by the power circuits can be based on signals received from local media controller 135 and can vary depending on the memory access operation being performed. Further details with regard to the design, position, and operation of the vertical string driver circuits 139 are described below.

Figure 2:
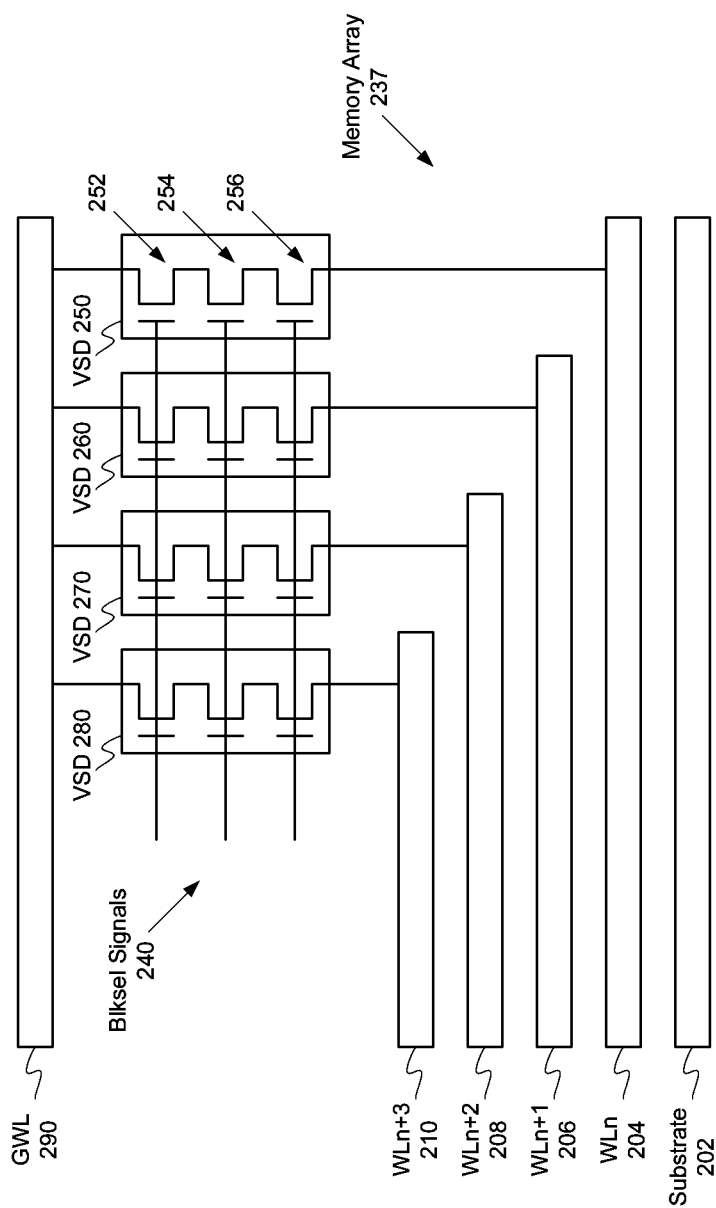
FIG. 2 is a diagram illustrating vertical string driver circuits disposed above a memory array in a memory device in accordance with some embodiments of the present disclosure.

FIG. 2 is a diagram illustrating vertical string driver circuits disposed above a memory array in a memory device in accordance with some embodiments of the present disclosure. The memory array 237 is one example of memory array 137, as illustrated in FIG. 1. In one embodiment, memory array 237 is disposed on or above a substrate 202. Substrate 202 can include, for example, a silicon wafer or other material upon which certain microelectronic devices can be built using various fabrication processes. In one embodiment, memory array 237 includes a number of vertically stacked layers, with each vertically stacked layer including one or more word lines. For example, FIG. 2 illustrates word lines WLn 204, WLn+1 206, WLn+2 208, and WLn+3 210, each in a different vertically stacked layer of memory array 237. It should be understood that each vertically stacked layer of memory array 237 can include additional word lines which are not illustrated in the side-view perspective of FIG. 2. Furthermore, in other embodiments, memory array 237 can include some other number of vertically stacked layers, such as additional or fewer layers.

In one embodiment, a portion of each of word line in memory array 237 is exposed beyond a word line in the layer immediate above. In one embodiment, during manufacture an etching process or other technique is used to expose the portion of each word line at one end to form a so-called "staircase" structure. The portion of each word line that is exposed can be referred to as a "tread" in the staircase, which rises from right to left in the illustration of FIG. 2. The staircase structure is used to allow for connection of other signal lines and/or circuitry to the word lines in each vertically stacked layer of memory array 237. In other embodiments, some other structure or arrangement can be used to connect such signal lines and/or circuitry to the word lines.

In one embodiment, there are a number of vertical string driver circuits, such as vertical string driver circuits 250, 260, 270, and 280, disposed above memory array 237. The vertical string driver circuits 250, 260, 270, and 280 are each examples of vertical string driver circuit 139, as illustrated in FIG. 1. As illustrated in FIG. 2, the word lines 204, 206, 208, and 210 of memory array 237 are disposed above substrate 202, and vertical string driver circuits 250, 260, 270, and 280 are disposed above the memory array 137. In one embodiment, each vertical string driver circuits is coupled to a respective one of the word lines in memory array 237, and is associated with applying signals to the respective word line. In one embodiment, each of vertical string driver circuits 250, 260, 270, and 280 is disposed above the portion (i.e., the tread of the staircase structure) of the respective word line that is exposed beyond the word line above. For example, virtual string driver circuit 250 is disposed above and coupled to the exposed portion of word line WLn 204, virtual string driver circuit 260 is disposed above and coupled to the exposed portion of word line WLn+1 206, virtual string driver circuit 270 is disposed above and coupled to the exposed portion of word line WLn+2 208, and virtual string driver circuit 280 is disposed above and coupled to the exposed portion of word line WLn+3 210. It should be understood that there can be additional vertical string driver circuits in the memory device, or more than one vertical string driver circuit, which are not illustrated in the side-view perspective of FIG. 2, coupled to any one of the word lines in memory array 237.

In one embodiment, each of the vertical string driver circuits includes one or more semiconductor devices, such as metal-oxide-semiconductor field-effect transistor (MOSFET) devices, or other switching devices. For example, vertical string driver circuit 250 includes devices 252, 254, and 256. In other embodiments, a vertical string driver circuit can include some other number of semiconductor devices, such as more or fewer devices. In one embodiment, devices 252, 254, and 256 are coupled in series between a global word line (GWL) 290 and the exposed portion of a respective word line of memory array 237 (i.e., WLn 204), and are controlled by respective block select (blksel) signals 240. In one embodiment, the semiconductor devices of each of vertical string driver circuits 250, 260, 270, and 280 are similarly coupled and are also controlled by block select signals 240. During the performance of a memory access operation, block select signals 240 either activate or deactivate the semiconductor devices of vertical string driver circuits 250, 260, 270, and 280 to either allow or prevent a voltage signal from global word line 290 to flow through to the respective word lines of memory array 237, as appropriate. In one embodiment, the block select signals are asserted by or caused to be asserted by local media controller 135 of the memory device 130.

Figure 3:
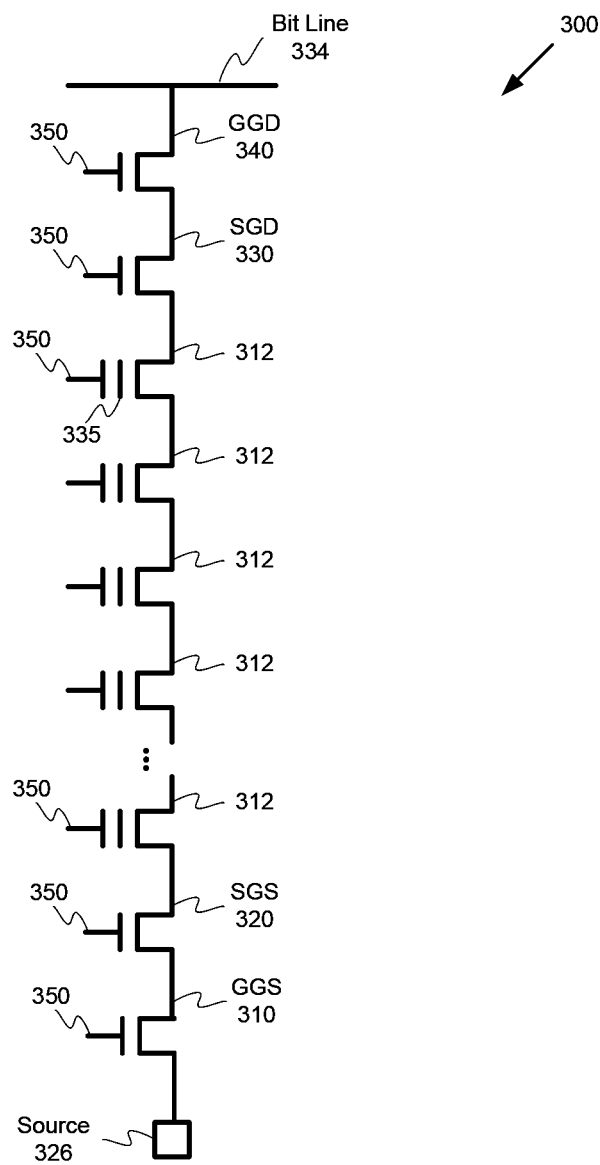
FIG. 3 is a schematic diagram illustrating a string of memory cells in a data block of a memory device in a memory sub-system in accordance with some embodiments of the present disclosure.

FIG. 3 is a schematic diagram illustrating a string 300 of memory cells in a data block of a memory device in a memory sub-system in accordance with some embodiments of the present disclosure. In one embodiment, the string 300 is representative of one portion of memory device 130 and a number of such strings can be formed across the vertically stacked layers of memory array 237. The string 300 includes a number of memory cells 312 (i.e., charge storage devices), such as up to 32 memory cells (or more) in some embodiments. The string 300 includes a source-side gate induced drain leakage (GIDL) generator 310 (GGS) (typically an n-channel transistor) and a source-side select transistor known as a source select gate 320 (SGS) (typically an n-channel transistor) coupled between a memory cell 312 at one end of the string 300 and a common source 326. The common source 326 may include, for example, a commonly doped semiconductor material and/or other conductive material. At the other end of the string 300, a drain-side select transistor called a drain select gate 330 (SGD) (typically an n-channel transistor) and a drain-side GIDL generator 340 (GGD) are coupled between one of the memory cells 312 and a data line 334, which is commonly referred to in the art as a "bit line." The common source 326 can be coupled to a reference voltage (e.g., ground voltage or simply "ground" [Gnd]) or a voltage source (e.g., a charge pump circuit or power supply which may be selectively configured to a particular voltage suitable for optimizing a programming operation).

Each memory cell 312 may include, for example, a floating gate transistor or a charge trap transistor and may comprise a single level memory cell or a multilevel memory cell. The floating gate may be referred to as a charge storage structure 335. The memory cells 312, the source select gate 320, the drain select gate 330, and the GIDL generator 340 can be controlled by signals on their respective control gates 350.

The control signals can be applied by or at the direction of local media controller 135 to select lines (not shown) to select strings, or to access lines (not shown) to select memory cells 312, for example. In some cases, the control gates can form a portion of the select lines (for select devices) or access lines (for cells). The drain select gate 330 receives a voltage that can cause the drain select gate 330 to select or deselect the string 300. In one embodiment, each respective control gate 350 is connected to a separate word line (i.e., access line), such that each device or memory cell can be separately controlled. The string 300 can be one of multiple strings of memory cells in a block of memory cells in memory device 130. For example, when multiple strings of memory cells are present, each memory cell 312 in string 300 may be connected to a corresponding shared word line, to which a corresponding memory cell in each of the multiple strings is also connected.

Figure 4:
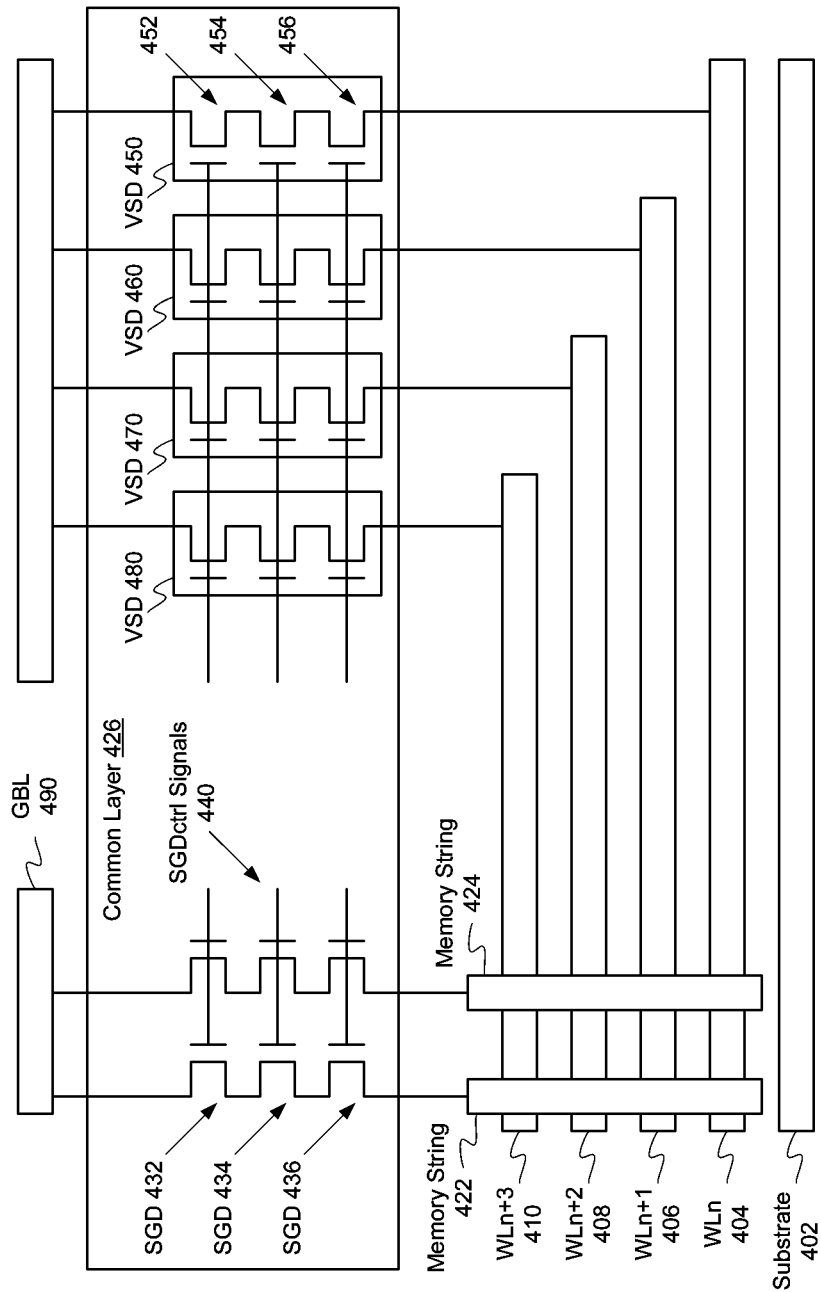
FIG. 4 is a diagram illustrating vertical string driver circuits and select gate devices disposed together in a common layer above a memory array in a memory device in accordance with some embodiments of the present disclosure.

FIG. 4 is a diagram illustrating vertical string driver circuits and select gate devices disposed together in a common layer above a memory array in a memory device in accordance with some embodiments of the present disclosure. In one embodiment, the memory array includes a number of memory strings, such as memory strings 422 and 424 formed across the vertically stacked layers of the memory array. The memory strings 422 and 424 are each examples of memory string 300, as illustrated in FIG. 3. As described above, each of the memory strings can include a number of memory cells, such as memory cell 312, each corresponding to a respective word line, such as one of word lines WLn 404, WLn+1 406, WLn+2 408, and WLn+3 410, which are formed above substrate 402. In addition, each memory string can include one or more select gate devices. For example, memory string 422 includes select gate devices 432, 434, 436. In other embodiments, a memory string can include some other number of select gate devices, such as more or fewer devices. In one embodiment, select gate devices 432, 434, and 436 are coupled in series between a global bit line (GBL) 490 and the rest of memory string 422, and are controlled by respective select gate control (SGDctrl) signals 440. In one embodiment, the select gate devices of each of memory strings 422 and 424 are similarly coupled and are also controlled by select gate control signals 440. During the performance of a memory access operation, select gate control signals 440 either activate or deactivate the select gate devices of memory strings 422 and 424 to either allow or prevent a voltage signal from global bit line 490 to flow through to the respective memory strings, as appropriate. In one embodiment, the select gate control signals are asserted by or caused to be asserted by local media controller 135 of the memory device 130.

Figure 5:
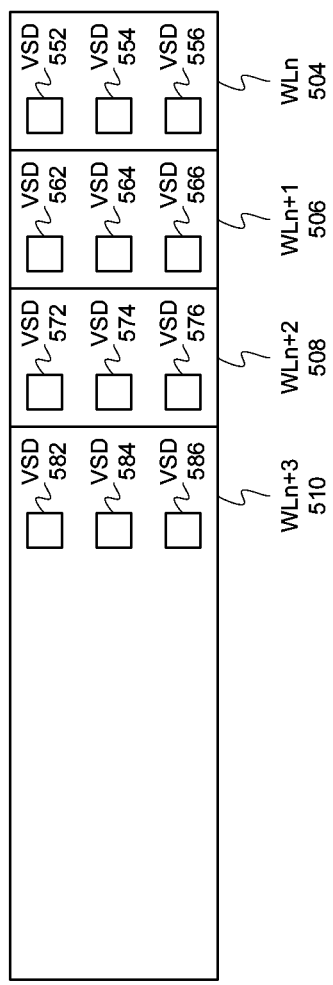
FIG. 5 is a diagram illustrating multiple vertical string driver circuits disposed above the exposed portions of each word line of a memory array in a memory device in accordance with some embodiments of the present disclosure.

In one embodiment, the select gate devices, including select gate devices 432, 434, and 436 and other devices, are disposed in a common layer, such as common layer 426 above the memory array together with one or more semiconductor devices, including semiconductor devices 452, 454, and 456 and other devices, of the vertical string driver circuits, such as vertical string driver circuits 450, 460, 470, and 480. Although FIG. 4 illustrates one vertical string driver circuit associated with each respective word line, it should be understood that in one embodiment, there can be two or more vertical string driver circuits, arranged in parallel, associated with each word line, as illustrated in FIG. 5. In one embodiment, common layer 426 is a top-most layer of the memory array. In another embodiment, common layer 426 is a separate layer disposed above the memory array. In one embodiment, the select gate devices and the semiconductor devices are a different type of device than the memory devices in the memory array. For example, the select gate devices, including select gate devices 432, 434, and 436, and the semiconductor devices, including semiconductor devices 452, 454, and 456, can be n-type metal oxide semiconductor (NMOS) devices. When the select gate devices and the semiconductor devices are formed in a common layer above the memory array, the processing costs are greatly reduced, since both sets of devices can be fabricated using fewer processing steps and the memory device can have fewer vertically stacked layers. Although FIG. 4 illustrates common layer 426 as including the same number of select gate devices as the number of semiconductor devices in each vertical string driver circuit, it should be understood that in other embodiments, there can be different numbers of select gate devices and semiconductor devices. For example, there can be more or fewer select gate devices than semiconductor devices in each vertical string driver circuit and/or the number of semiconductor devices in each vertical string driver circuit can vary, such that at least one vertical string driver circuit has more or fewer semiconductor devices than at least one other vertical string driver circuit.

FIG. 5 is a diagram illustrating multiple vertical string driver circuits disposed above the exposed portions of each word line of a memory array in a memory device in accordance with some embodiments of the present disclosure. FIG. 5 is a top down view of multiple word lines in multiple vertically stacked layers of a memory array, such as memory array 137 of FIG. 1 or memory array 237 of FIG. 2. In FIG. 5, a number of word lines are illustrated, including word lines WLn 504, WLn+1 506, WLn+2 508, and WLn+3 510 which are arranged in the staircase structure described above. As such, a portion of each word line is exposed beyond the word line in the layer above. For example, a portion of WLn 504 is exposed beyond word line WLn+1 506, a portion of WLn+1 506 is exposed beyond word line WLn+2 508, and a portion of WLn+2 508 is exposed beyond word line WLn+3 510. In one embodiment, there are multiple vertical string driver circuits (e.g., two or more vertical string driver circuits) disposed above the exposed portion of each word line. For example, vertical string driver circuits 552, 554 and 556 are coupled to and disposed above the exposed portion of WLn 504, vertical string driver circuits 562, 564 and 566 are coupled to and disposed above the exposed portion of WLn+1 506, vertical string driver circuits 572, 574 and 576 are coupled to and disposed above the exposed portion of WLn+2 508, and vertical string driver circuits 582, 584 and 586 are coupled to and disposed above a portion of WLn+3 510. In one embodiment, the multiple vertical string driver circuits coupled to each respective word line are connected in parallel to increase current flow and lower resistance. In other embodiments, there can be some other number of vertical string driver circuits coupled to each respective word line, including more or fewer circuits. Although FIG. 5 illustrates a same number of vertical string driver circuits arranged in parallel and associated with each word line, in other embodiments, the number of vertical string driver circuits associated with each word line can vary, such that at least one word line has more or fewer associated vertical string driver circuits than at least one other word line.

FIGS. 6A-6D are diagrams illustrating the exposed portions of each word line of a memory array in a memory device in accordance with some embodiments of the present disclosure. FIG. 6A is a top down view of multiple word lines in multiple vertically stacked layers of a memory array, such as memory array 137 of FIG. 1 or memory array 237 of FIG. 2. In FIG. 6A, a number of word lines are illustrated, including word lines WLn 604 and WLn+1 506, which are arranged in the staircase structure described above. As such, a portion of each word line is exposed beyond the word line in the layer above. For example, a portion of WLn 604 is exposed beyond word line WLn+1 606. That exposed portion, referred to as a tread, can occupy an entire width of the word lines, referred to herein as the "block pitch" 608. FIG. 6B is a side view of multiple word lines in multiple vertically stacked layers of the memory array, illustrating how a portion of WLn 604 is exposed beyond word line WLn+1 606.

FIG. 6C is a top down view of multiple word lines in multiple vertically stacked layers of a memory array, such as memory array 137 of FIG. 1 or memory array 237 of FIG. 2. In FIG. 6C, a number of word lines are illustrated, including word lines WLn 604, WLn+1 606, WLn+2 608, and WLn+3 610. FIG. 6D is a top down exploded view of multiple word lines, including WLn 604 and WLn+1 506. Although WLn 604 and WLn+1 506 would normally be disposed directly on top of one another in adjacent vertically stacked layers, in FIG. 6D WLn 604 and WLn+1 506 are shown apart from one another for ease of understanding. As shown in FIG. 6D, each of WLn 604 and WLn+1 506 includes an exposed tab. For example, WLn 604 includes tab 614 and WLn+1 506 includes tab 616. As illustrated in FIG. 6C, the tab 614 of WLn 604 and the tab 616 of WLn+1 606 each occupy a fraction of the block pitch 608 of the word lines, thereby allowing a portion of two word lines from two vertically stacked layers to be exposed in the space of a single tread. Similarly, a tab of WLn+2 608 and a tab of WLn+3 610 also each occupy a fraction of the block pitch 608 in a next tread of the staircase structure. Thus, when portions of two word lines are exposed in a single tread, the length of the staircase structure can be reduced by approximately 50%. In other embodiments, a portion of some other number of word lines can be exposed in the space of a single tread, thereby further reducing the length of the staircase structure.

In one embodiment, one or more vertical string driver circuits are coupled to and disposed above the exposed portions of each word line in the memory array. For example, as shown in FIG. 6C and FIG. 6D, a vertical string driver circuit 650 is disposed above the tab 614 of WLn 604 and a vertical string driver circuit 660 is disposed above the tab 616 of WLn+1 606. Furthermore, as shown in FIG. 6C, a vertical string driver circuit 670 is disposed above the tab of WLn+2 608 and a vertical string driver circuit 680 is disposed above the tab of WLn+3 610. In other embodiments, some other number of vertical string driver circuits can be disposed above and coupled to the exposed portions of the various word lines, such as two or more vertical string driver circuits.

Figure 7:
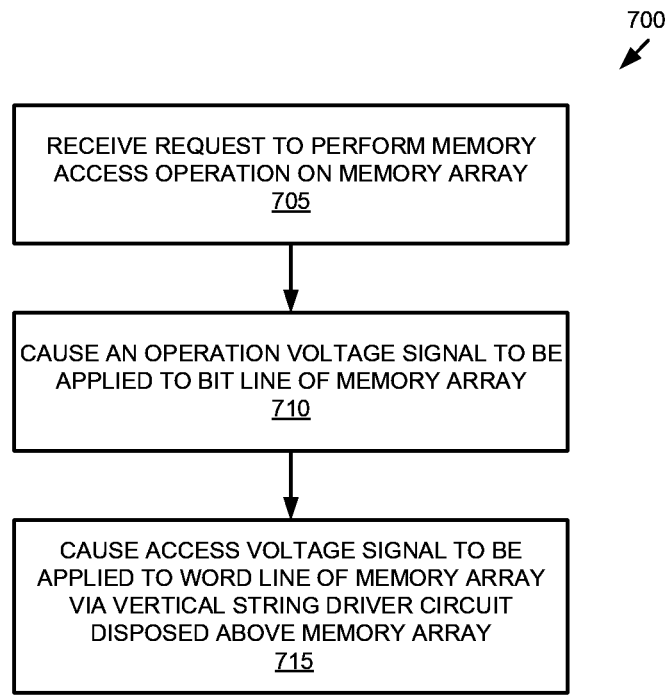
FIG. 7 is a flow diagram of an example method of performing a memory access operation on a memory array of a memory device using a vertical string driver, in accordance with some embodiments of the present disclosure.

FIG. 7 is a flow diagram of an example method of performing a memory access operation on a memory array of a memory device using a vertical string driver, in accordance with some embodiments of the present disclosure. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by local media controller 135 on the memory array 137 and vertical string driver circuit 139 of memory device 130 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 705, a memory access operation is initiated. For example, a component in memory sub-system 110 (e.g. processor 117, memory sub-system controller 115 or local media controller 135) can send a request to perform the memory access operation on a memory device (e.g., memory device 130). The memory access operation can include, for example, a program operation, a read operation, an erase operation, or some other operation. In one embodiment, local media controller 135 receives the request to perform the memory access operation on the memory device 130. In response, local media controller 135 can initiate the memory access operation, such as for a block of memory device 130 including one or more memory strings, such as string 300.

At operation 710, an operation voltage signal is applied. For example, the processing logic can cause a voltage signal, such as a program voltage signal, a read voltage signal, or an erase voltage signal to be applied to string 300 (e.g., be applied to bit line 334 or string 300). The magnitude of the voltage signal can depend on the type of memory access operation being performed. For example, a program voltage signal can be sufficient to cause electrons to flow into the channel region of string 300, thereby storing charge at certain memory cells and programming the memory. Conversely, for example, an erase voltage signal can cause electrons stored in the channel region to flow out, thereby reducing the stored charge and erasing the memory.

At operation 715, additional voltage signals are applied. For example, the processing logic can cause access voltage signals to be applied to certain data lines, such as word lines, in the memory array. In one embodiment, the access voltage signals are applied via a string driver circuit, such as one of vertical string driver circuits 250, 260, 270, or 280, of FIG. 2. By causing the corresponding blksel signals 240 to be applied to the semiconductor devices of the vertical string driver circuits, local media controller 135 causes the access voltage signal from global word line 290 to flow through to selected ones of word lines 204, 206, 208, 210. The access voltage signal on these word lines effectively selects the corresponding memory cells 312 on which the corresponding memory access operation is to be performed.

Figure 8:
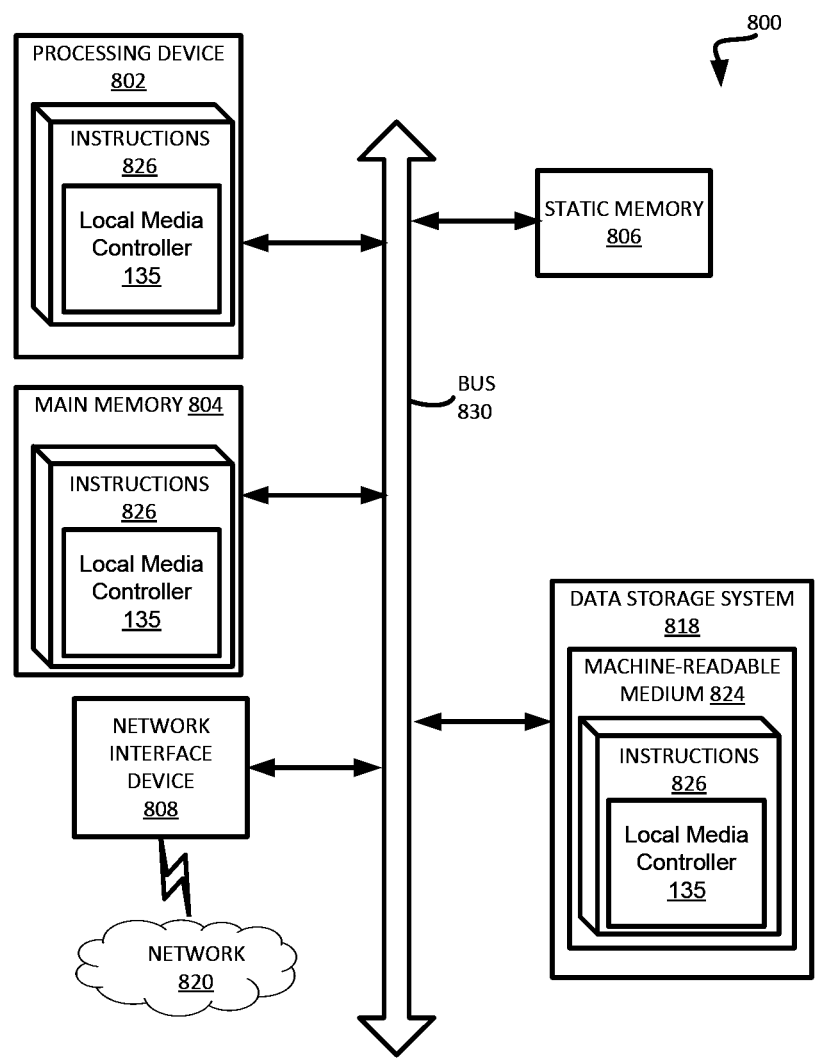
FIG. 8 is a block diagram of an example computer system in which embodiments of the present disclosure can operate.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the local media controller 135 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium, such as a non-transitory computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1.

In one embodiment, the instructions 826 include instructions to implement functionality corresponding to the local media controller 135 of FIG. 1). While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
a substrate;
a memory array disposed above the substrate, the memory array comprising a plurality of vertically stacked layers, each vertically stacked layer comprising a plurality of word lines; and
a plurality of vertical string driver circuits disposed above the memory array, wherein each of the plurality of vertical string driver circuits comprises a plurality of semiconductor devices coupled in series to a respective one of the plurality of word lines.

2. The memory device of claim 1, wherein the memory array comprises a plurality of memory strings formed across the plurality of vertically stacked layers, each of the plurality of plurality of memory strings comprising one or more select gate devices to couple the respective memory strings to a bit line.

3. The memory device of claim 2, wherein the plurality of semiconductor devices and the one or more select gate devices are disposed together in a common layer above the memory array.

4. The memory device of claim 3, wherein the plurality of semiconductor devices and the one or more select gate devices are n-type metal oxide semiconductor (NMOS) devices.

5. The memory device of claim 1, wherein a portion of a first word line in a first vertically stacked layer of the plurality of layers is exposed beyond a second word line in a second vertically stacked layer above the first vertically stacked layer of the plurality of vertically stacked layers.

6. The memory device of claim 5, wherein a respective one of the plurality of vertical string driver circuits coupled to the first word line is disposed above the portion of the first word line that is exposed beyond the second word line.

7. The memory device of claim 5, wherein two or more of the plurality of vertical string driver circuits are coupled to the first word line and are disposed above the portion of the first word line that is exposed beyond the second word line.

8. The memory device of claim 1, wherein a first tab of a first word line in a first vertically stacked layer of the plurality of layers and a second tab of a second word line in a second vertically stacked layer above the first vertically stacked layer in the plurality of layers are exposed beyond a third vertically stacked layer above the second vertically stacked layer in the plurality of vertically stacked layers, the first tab of the first word line and the second tab of the second word line each comprising a fraction of a block pitch of the plurality of word lines in the memory array.

9. The memory device of claim 8, wherein a first vertical string driver circuit of the plurality of vertical string driver circuits coupled to the first word line is disposed above the first tab of the first word line and wherein a second vertical string driver circuit of the plurality of vertical string driver circuits coupled to the second word line is disposed above the second tab of the second word line.

10. A method of performing a memory access operation on a memory device, the method comprising:
receiving a request to perform the memory access operation on the memory device, the memory device comprising a memory array comprising a plurality of vertically stacked layers, each vertically stacked layer comprising a plurality of word lines;
causing an operation voltage signal to be applied to a bit line of a plurality of bit lines of the memory array; and
causing an access voltage signal to be applied to a word line of the plurality of word lines via a vertical string driver circuit of a plurality of vertical string driver circuits disposed above the memory array, wherein each of the plurality of vertical string driver circuits comprises a plurality of semiconductor devices coupled in series to a respective one of the plurality of word lines.

11. The method of claim 10, wherein the memory array comprises a plurality of memory strings formed across the plurality of vertically stacked layers, each of the plurality of plurality of memory strings comprising one or more select gate devices to couple the respective memory strings to a respective bit line of the plurality of bit lines.

12. The method of claim 11, wherein the plurality of semiconductor devices and the one or more select gate devices are disposed together in a common layer above the memory array.

13. The method of claim 12, wherein the plurality of semiconductor devices and the one or more select gate devices are n-type metal oxide semiconductor (NMOS) devices.

14. The method of claim 10, wherein a portion of a first word line in a first vertically stacked layer of the plurality of layers is exposed beyond a second word line in a second vertically stacked layer above the first vertically stacked layer of the plurality of vertically stacked layers.

15. The method of claim 14, wherein a respective one of the plurality of vertical string driver circuits coupled to the first word line is disposed above the portion of the first word line that is exposed beyond the second word line.

16. The method of claim 14, wherein two or more of the plurality of vertical string driver circuits are coupled to the first word line and are disposed above the portion of the first word line that is exposed beyond the second word line.

17. The method of claim 10, wherein a first tab of a first word line in a first vertically stacked layer of the plurality of layers and a second tab of a second word line in a second vertically stacked layer above the first vertically stacked layer in the plurality of layers are exposed beyond a third vertically stacked layer above the second vertically stacked layer in the plurality of vertically stacked layers, the first tab of the first word line and the second tab of the second word line each comprising a fraction of a block pitch of the plurality of word lines in the memory array.

18. The method of claim 17, wherein a first vertical string driver circuit of the plurality of vertical string driver circuits coupled to the first word line is disposed above the first tab of the first word line and wherein a second vertical string driver circuit of the plurality of vertical string driver circuits coupled to the second word line is disposed above the second tab of the second word line.

\* \* \* \* \*